United States Patent
Kao et al.

(10) Patent No.: US 6,519,756 B1
(45) Date of Patent: Feb. 11, 2003

(54) METHOD AND APPARATUS FOR BUILDING AN INTEGRATED CIRCUIT

(75) Inventors: Russell Kao, Portola Valley, CA (US); Zhaoyun Xing, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/412,285

(22) Filed: Oct. 5, 1999

(51) Int. Cl.$^7$ ............................................. G06F 17/50
(52) U.S. Cl. ............................. 716/18; 716/4; 365/51
(58) Field of Search ................... 365/51, 226; 707/10; 716/1–21

(56) References Cited

U.S. PATENT DOCUMENTS

| | | | |
|---|---|---|---|
| 5,029,102 A | * 7/1991 | Drumm et al. | 716/18 |
| 5,650,955 A | * 7/1997 | Puar et al. | 365/51 |
| 5,764,534 A | 6/1998 | Goetting | 364/491 |
| 6,098,068 A | * 8/2000 | Brown | 707/10 |
| 6,324,678 B1 | * 11/2001 | Dangelo et al. | 716/18 |
| 6,345,379 B1 | * 2/2002 | Khouja et al. | 716/4 |
| 6,356,497 B1 | * 3/2002 | Puar et al. | 365/226 |

FOREIGN PATENT DOCUMENTS

| | | | |
|---|---|---|---|
| WO | WO 95/32476 | 11/1995 | G06F/15/60 |
| WO | WO 98/49638 | 11/1998 | G06F/17/50 |

OTHER PUBLICATIONS

James Hwang, Cameron Patterson, Eric Dellinger, Sujoy Mitra and Ralph Witting, "Generating Layouts for Self-implementing Modules", Aug. 31, 1998, 525 to 529, from The International Workshop on Field Programable Logic and Applications, FPGAS, Abingon, GB.

1988 IEEE, Patchwork, "Layout From Schematic Annotations," Richard Barth, Louis Monier and Bertrand Serlet, pp. 250–255.

* cited by examiner

Primary Examiner—Matthew Smith
Assistant Examiner—H Rossoshek
(74) Attorney, Agent, or Firm—Gunnison, McKay & Hodgson, L.L.P.; Philip J. McKay

(57) ABSTRACT

A method and apparatus for building an integrated circuit. A description of the logical operation of a module in a hardware description language is provided, which includes annotations in the form of design directives. An interpreting process is configured to read the annotations and identify which logical and physical design tools are needed to process each module in the description, as well as the order in which to invoke the logical physical design tools. Dependencies in the execution of the design tools on the various modules of the description are analyzed to determine where the processing of modules may be performed in parallel to optimize execution.

18 Claims, 6 Drawing Sheets

METHOD AND APPARATUS FOR BUILDING AN INTEGRATED CIRCUIT

BACKGROUND OF THE INVENTION

1. Field of the Invention

The present invention relates generally to the field of hardware description languages, and, more specifically, to building of integrated circuits such as ASICs.

Sun, Sun Microsystems, the Sun logo, Java and all Java-based trademarks and logos are trademarks or registered trademarks of Sun Microsystems, Inc. in the United States and other countries. All SPARC trademarks are used under license and are trademarks of SPARC International, Inc. in the United States and other countries. Products bearing SPARC trademarks are based upon an architecture developed by Sun Microsystems, Inc.

2. Background Art

Designers of integrated chips, such as application specific integrated chips ("ASIC"), typically rely on a computer aided design ("CAD") program using a hardware description language to assist in their design. Hardware description languages allow the designer to specify, in software, the logical operation of the chip they are designing. Typical hardware description languages include Verilog, Synopsys MCL, and VHDL.

Present design processes consist of several steps. First, the designer writes a software program describing the flow of signals in the chip and the logical operations performed on those signals. In Verilog, for example, such a program is written at the so-called "Register Transfer Level" ("RTL"). Once the designer has programmed the operation of the logic circuit, the program is simulated and, if acceptable, synthesized into a corresponding collection of standard cells. Standard cells are components, such as logic gates, latches, decoders, and various other components, that exist in a library accessible by a synthesis tool. The synthesis step is typically an automated process in which the synthesis tool determines the appropriate standard cells and interconnections between standard cells to realize a circuit that satisfies the RTL model. At this point, the chip is ready for physical design; that is, the physical placement of the synthesized standard cells and the routing of interconnections (wires) among them. Physical designers typically use automated tools to aid in placement and routing.

Currently, the logical design (i.e., preparation of the RTL program) and the eventual physical design of the chip are separate steps in the design process. In fact, the two steps are often performed by separate people using separate tools, or the physical design may even be performed by a physical designer at another company. This decoupling of the logical and physical design has become unsatisfactory. For example, since the physical design is performed by a separate person, that person is likely not familiar with the overall function or desired performance of the chip as envisioned by the logic designer, which may lead to an inoperable physical design. As technology has advanced, the time delay introduced by physical components ("gate delay") had decreased such that the delay introduced by interconnecting wires ("wire delay") is of increasing importance. A physical layout that does not adequately account for wire delay could lead to a layout with unexpected delays in signal propagation which, as a result, does not meet the timing goals envisioned by the logic designer. As another example, a design may have a regularity to its structure that is not readily discoverable by the physical designer or by automatic placement algorithms. This regularity, known to the logic designer, is lost in the final physical design.

Circuit design is often an iterative process in which the same RTL description may be processed (i.e., synthesized and/or physically placed and routed) multiple times. The changes to the RTL description that cause the circuit to be reprocessed are often incremental changes to only a few modules within the circuit design. Other modules that are not dependent on the changed modules may be reprocessed unnecessarily, resulting in inefficient use of time and processing resources.

SUMMARY OF THE INVENTION

A method and apparatus for building an integrated circuit are described. A description of the logical operation of a module in a hardware description language is provided, which includes annotations in the form of design directives. An interpreting process is configured to red the annotations and identify which logical and physical design tools are needed to process each module in the description, as well as the order in which to invoke the logical and physical design tools.

In one or more embodiments, dependencies in the execution of the design tools on the various modules of the description are analyzed to determine whether the processing of modules may be performed in parallel to optimize execution. The dependency analysis comprises, for example, the generation of a dependency graph.

In one or more embodiments, the description and the intermediate results of the execution of the design tools are cached in memory. A current description is compared with a prior cached description to determine which modules are revised in the current description. Those execution steps that entail redundant processing of unrevised modules are bypassed, and the corresponding prior cached results are utilized in those instances.

DETAILED DESCRIPTION OF THE INVENTION

The invention is a method and apparatus for building an integrated circuit. In the following description, numerous specific details are set forth to provide a more thorough description of embodiments of the invention. It will be apparent, however, to one skilled in the art, that the invention may be practiced without these specific details. In other instances, well known features have not been described in detail so as not to obscure the invention.

Embodiments of the invention perform automated processing of circuit descriptions comprising annotations, or design directives, that direct the synthesis, placement, and routing of the chip. The annotation of hardware description language code with physical design directives gives logic designers a high degree of control over the synthesis and physical design of a chip. Because the logic designer is aware of regularities in the structure, and is aware of timing constraints required by the design, the logic designer is in a better position to create an efficient physical layout. The control over the layout leads to denser layouts, shorter wires, and more predictable wire delay. Further, the use of a single unified description for logical and physical design enables optimization in the scheduling of execution of automated design tools, and facilitates the identification and bypass of redundant processes for iterative designs.

As described in more detail below, an implementation generally involves the annotation of a hardware description language program, such as an RTL program, with design directives that control the synthesis, placement, and routing of a chip. A CAD program accepts the annotated RTL code and produces a layout using the annotations to guide the physical design of the chip, limiting the need for further human intervention.

Embodiment of Computer Execution Environment (Hardware)

Figure 1:
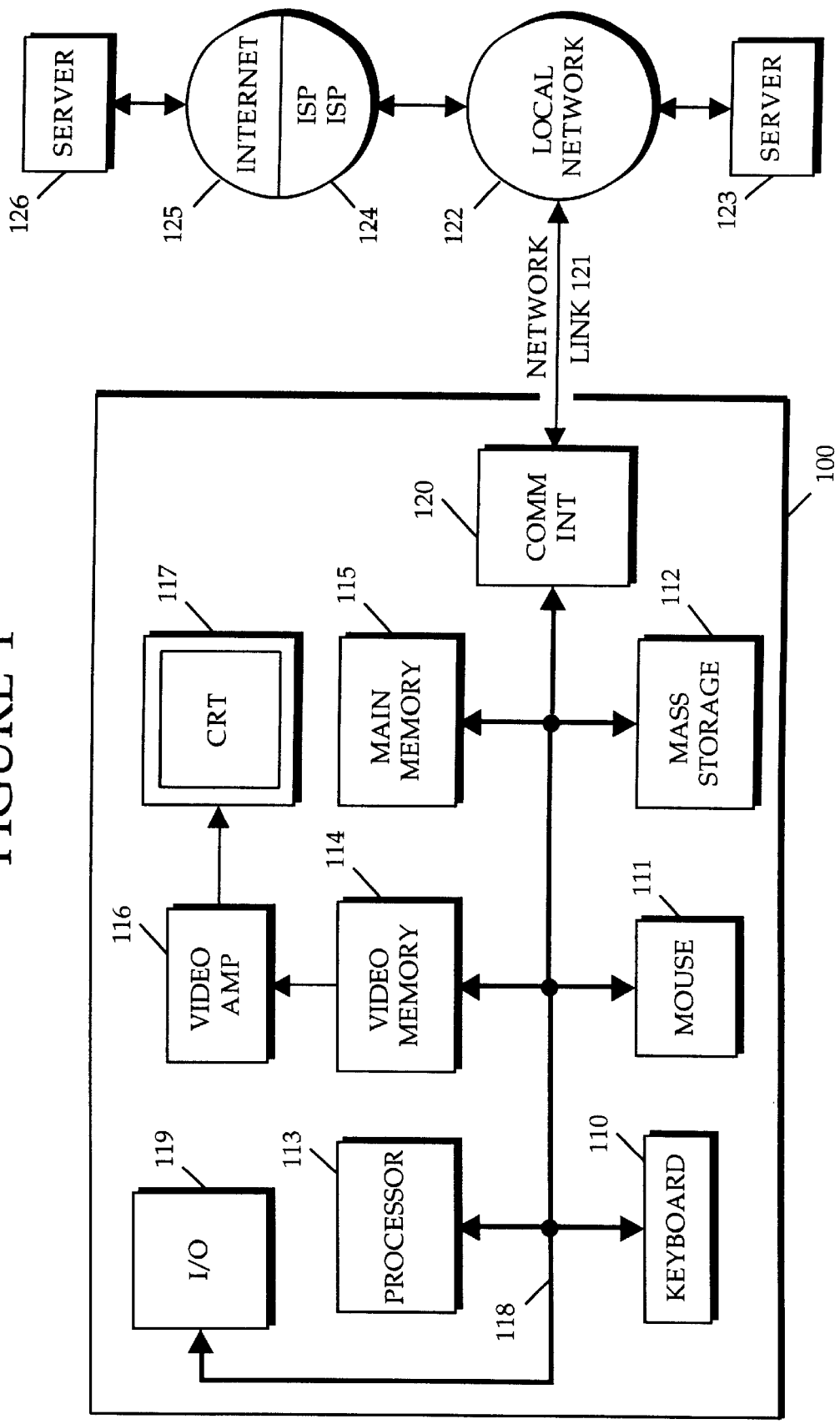
FIG. 1 is a drawing of a computer system in which systems consistent with the principles of the invention may be implemented.

An embodiment of the invention can be implemented as computer software in the form of compute readable code executed on a general purpose computer such as computer 100 illustrated in FIG. 1, or in the form of programs or class files executable within a runtime environment (e.g., the JAVA™ Runtime Environment) running on such a computer. The computer systems described below are for purposes of example only. An embodiment of the invention may be implemented in any type of computer system or programming or processing environment, including "thin" client processing environments (e.g., network computers (NC's), etc).

In FIG. 1, a keyboard 110 and mouse 111 are coupled to a system bus 118. The keyboard and mouse are for introducing user input to the computer system and communicating that user input to processor 113. Other suitable input devices may be used in addition to, or in place of, the mouse 111 and keyboard 110. I/O (input/output) unit 119 coupled to system bus 118 represents such I/O elements as a printer, A/V (audio/video) I/O, etc.

Computer 100 includes a video memory 114, main memory 115 and mass storage 112, all coupled to system bus 118 along with keyboard 110, mouse 111 and processor 113. The mass storage 112 may include both fixed and removable media, such as magnetic, optical or magnetic optical storage systems or any other available mass storage technology. Bus 118 may contain, for example, address lines for addressing video memory 114 or main memory 115. The system bus 118 also includes, for example, a data bus for transferring data between and among the components, such as processor 113, main memory 115, video memory 114 and mass storage 112. Alternatively, multiplex data/address lines may be used instead of separate data and address lines.

In one embodiment of the invention, the processor 113 is a SPARC™ microprocessor from Sun Microsystems, Inc., or a microprocessor manufactured by Motorola, such as the 680X0 processor, or a microprocessor manufactured by Intel, such as the 80X86, or Pentium processor. However, any other suitable microprocessor or microcomputer may be utilized. Main memory 115 is comprised of dynamic random access memory (DRAM). Video memory 114 is a dual-ported video random access memory. One port of the video memory 114 is coupled to video amplifier 116. The video amplifier 116 is used to drive the cathode ray tube (CRT) raster monitor 117. Video amplifier 116 is well known in the art and may be implemented by any suitable apparatus. This circuitry converts pixel data stored in video memory 114 to a raster signal suitable for use by monitor 117. Monitor 117 is a type of monitor suitable for displaying graphic images. Alternatively, the video memory could be used to drive a flat panel or liquid crystal display (LCD), or any other suitable data presentation device.

Computer 100 may also include a communication interface 120 coupled to bus 118. Communication interface 120 provides a two-way data communication coupling via a network link 121 to a local network 122. For example, if communication interface 120 is an integrated services digital network (ISDN) card or a modem, communication interface 120 provides a data communication connection to the corresponding type of telephone line, which comprises part of network link 121. If communication interface 120 is a local area network (LAN) card, communication interface 120 provides a data communication connection via network link 121 to a compatible LAN. Communication interface 120 could also be a cable modem or wireless interface. In any such implementation, communication interface 120 sends and receives electrical, electromagnetic or optical signals which carry digital data streams representing various types of information.

Network link 121 typically provides data communication through one or more networks to other data devices. For example, network link 121 may provide a connection through local network 122 to local server computer 123 or to data equipment operated by an Internet Service Provider (ISP) 124. ISP 124 in turn provides data communication services through the world wide packet data communication network now commonly referred to as the "Internet" 125. Local network 122 and Internet 125 both use electrical, electromagnetic or optical signals which carry digital data streams. The signals through the various networks and the signals on network link 121 and through communication interface 120, which carry the digital data to and from computer 100, are exemplary forms of carrier waves transporting the information.

Computer 100 can send messages and receive data, including program code, through the network(s), network link 121, and communication interface 120. In the Internet example, remote server computer 126 might transmit a requested code for an application program through Internet 125, ISP 124, local network 122 and communication interface 120.

The received code may be executed by processor 113 as it is received and/or stored in mass storage 112, or other non-volatile storage for later execution. In this manner, computer 100 may obtain application code in the form of a carrier wave. In accordance with an embodiment of the invention, an example of such a downloaded application is the apparatus for building an integrated circuit described herein.

Application code may be embodied in any form of computer program product. A computer program product comprises a medium configured to store or transport computer readable code or data, or in which computer readable code or data may be embedded. Some examples of computer program products are CD-ROM disks, ROM cards, floppy disks, magnetic tapes, computer hard drives, servers on a network, and carrier waves.

Annotated Descriptions

Figure 2:
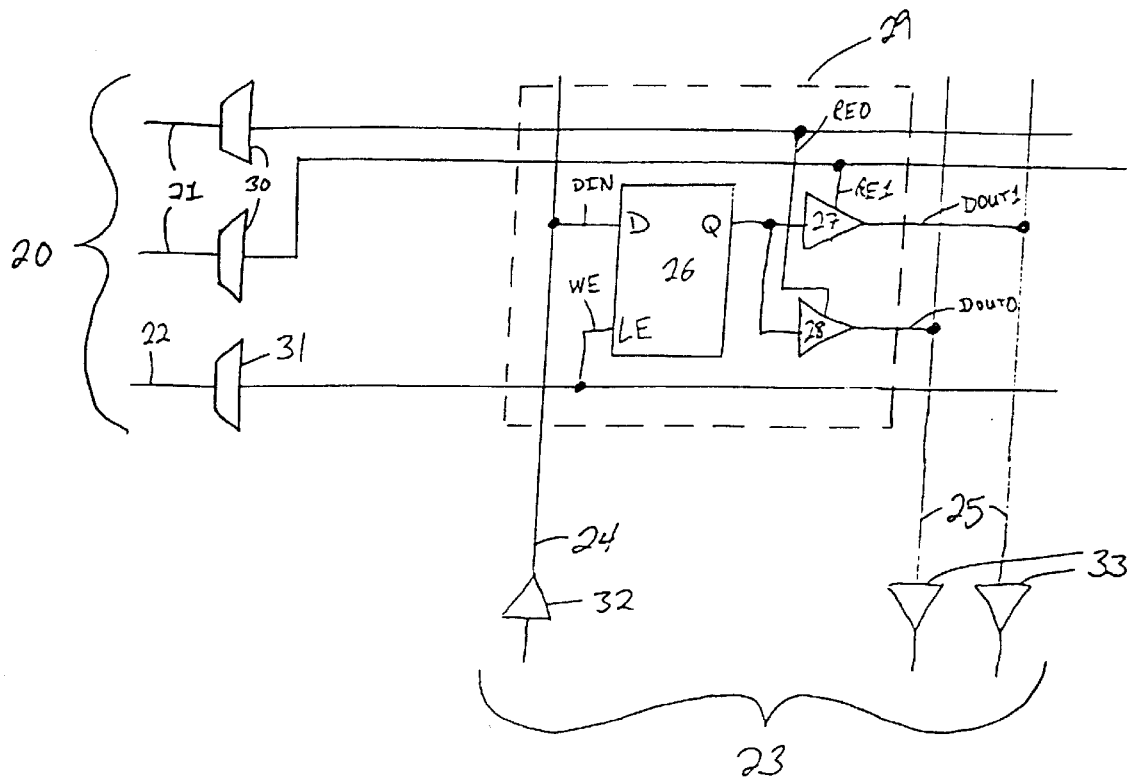
FIG. 2 is a simplified schematic of a register file.

Suppose a logic designer desired to design a register file consisting of 32 words of 64 bits each. FIG. 2 schematically shows one cell 29 of such a register file. The cell includes a latch 26 and two tri-state buffers 27 and 28. Latch 26 has an input line DIN and a write enable line WE. Tri-state buffers 27 and 28 have output lines DOUT1 and DOUT0 and are enabled by lines RE1 an RE0, respectively. In the actual design, cell 29 is replicated horizontally to form a row of 64 cells, and that row is replicated 32 times to form the core of the register file. Also shown are address decoders 20 consisting of two read address lines 21, two read decoders 30, a write address line 22, and a write decoder 31, and data buffers 23 consisting of a write bit line 24, a write data buffer 32, two read bit lines 25, and read data buffers 33. Data buffers 23 are physically located below the core while address decoders 20 are located to the left of the core.

An example of an RTL description of the register cell in the Verilog hardware description language is:

```
module regcell (dout0, dout1, din, we, re0, re1);
    input din, we, re0, re1;
    output dout0, dout1;
    tri dout0, dout1;
    reg q;
    always @(we) if (we) q=din;
    bufif1 b1 (dout0, q, re0);
    bufif1 b1 (dout1, q, re1);
endmodule
```

This module defines the logical operation of cell 29 of FIG. 2. It accepts inputs DIN, WE, RE0, and RE1, and produces outputs DOUT0 and DOUT1. Consistent with the present implementation, the logic designer has the ability to annotate such an RTL description with design directives. This is accomplished, in one embodiment, by including a program fragment within comments in the RTL program. Such a program fragment may be, for example, configured to invoke stored methods from a physical design library, which may be included in or appended to an API of a runtime system. Though any programming language and runtime system may be used for implementing annotations in the form of program fragments, one possible implementation uses program fragments written in the Java programming language.

In Verilog, comments to an RTL file being with /* and end with */. However, when annotating an RTL program with program fragments, the designer begins comments with a particular identifier, such as /*CAD. The programmer then inserts a program containing design directives into the comments and ends the comments with the usual symbol */. When reading the annotated RTL program, the CAD program recognizes the identifier /*CAD as the beginning of a program containing design directives. The CAD program then executes the program and produces a layout consistent with those directives.

There are substantial benefits to including physical design annotations within comments of the RTL program. For example, this method of including physical design annotations will work with any existing hardware description language, rather than requiring a rewrite of a hardware description language to include physical design primitives. This is important because many programs have already been written in accepted hardware description languages. In order to take advantage of the benefits of the present invention, these previously written programs need not be converted to a new hardware description language. Instead, they can simply be annotated with physical design directives in the same manner as described above. Also, including physical design directives within comments accommodates existing simulation and synthesis tools, which ignore embedded comments. Thus, the logic designer can include physical design annotations that are transparent to existing simulation and synthesis tools. It will be apparent, however, that forms of annotation other than comments may be utilized in other embodiments of the invention.

Numerous annotations reflecting physical design directives can be envisioned, some of which are discussed herein by way of illustration. There are times, for example, when it would be convenient for the designer to specify the width, height, or aspect ratio of the resulting design, while allowing automatic placement of standard cells within the specified criteria. Take, for instance, the following annotated version of the above regCell module:

```
module regcell (dout0, dout1, din, we, re0, re1);
    input din, we, re0, re1;
    output dout0, dout1;
    tri dout0, dout1;
    reg q;
    always @ (we) if (we) q=din;
    bufif1b1(dout0, q, re0)
    bufif1b1(dout1, q, re1);
    /*CAD
        autoPlace (FIXED_ASPECT, 1.0);
    */
endmodule
```

Figure 3:
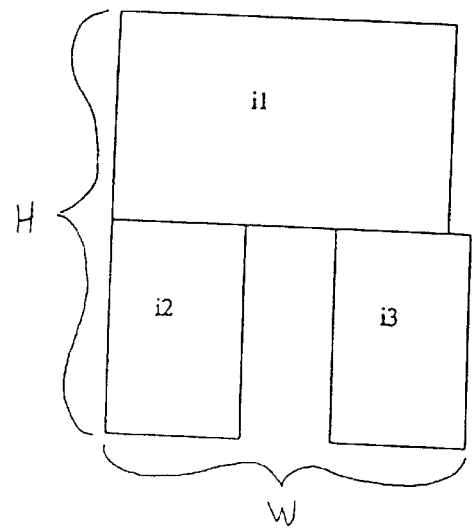
FIG. 3 is a diagram illustrating a layout of a register cell.

The CAD program reading this portion of the RTL program recognizes the /*CAD identifier and interprets the commands following the identifier as program code. The CAD program executes the embedded code, executing the "autoPlace" method, which invokes an automatic placement algorithm. The arguments to the function specify that standard cells should be placed in a rectangle with an aspect ration (height/width) of 1.0. The resulting layout is shown in FIG. 3, consisting of three standard cells i1, i2, and i3, that make up the synthesized regCell module. This layout is shared by all instances of the regCell module. Consistent with the designer's intention, the standard cells have been placed in an area having equal height H and width W (i.e., an aspect ratio of 1.0). Other arguments to the autoPlace method could specify just the height ("FIXED_HEIGHT") or width ("FIXED_WIDTH"), in microns, of the resulting design.

With the above simple regCell example, the automatic placer can produce an acceptable design with no additional information. In other designs, however, placement can be improved if information is provided about the location of inputs and outputs of the module. The following module describes a decoder that selects one of 32 outputs based on a five-bit input:

```
module decoder32_read (out, sel);
    input [4:0] sel;
    output [31:0] out;
    reg [31:0] out;
    decoder32 d(out, sel, 1'b1);
    /*CAD
        for (int i=4; i>=0; i--)
            placePort (L, "sel ["+ i + "]");
        for (int i=31; i>=0; i--)
            placePort (R, "out[" + i + "]");
    */
```

Figure 4:
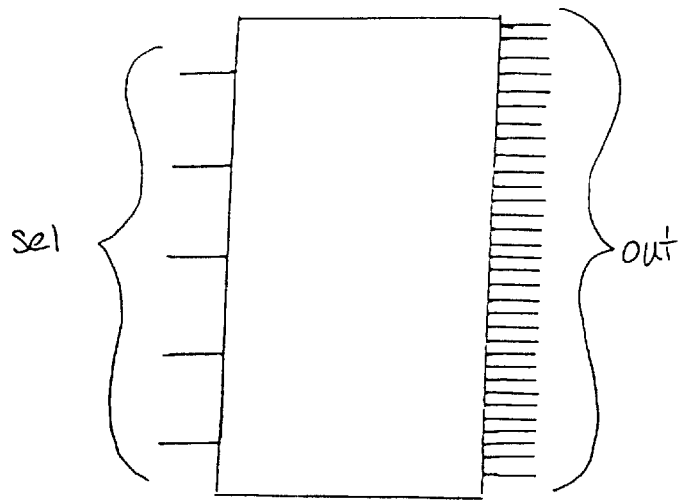
FIG. 4 is a diagram illustrating a layout of a decoder.

The "placePort" method allows the designer to specify the location of inputs and outputs to the module. It accepts the arguments T, B, L, or R for the top, bottom, left or right, respectively. The second argument specifies the port name. The result of the above annotation, shown in FIG. 4, is that the "sel," or input, ports are spaced evenly along the left of the module and the "out," or output, ports are spaced evenly along the right of the module. Another advantage illustrated by this example is the ability to include loops, such as the "for" loop used above, in annotations. Loops save the designer considerable time and effort by eliminating the need to repetitively enter annotations. In this example, the designer avoids separately entering physical design directives for each input and output port by using a "for" loop.

Other information that can be provided when using the automatic placer is (1) area utilization target ("SetUtilRate") and (2) row spacing and orientation. The area utilization target directive specifies how much of the available area, expressed as a percentage, should be occupied by the standard cells used in the physical design. Such an annotation can be helpful if the logic designer would like to leave a certain amount of space to achieve an acceptable wire route between standard cells. Row spacing and orientation directives allow the designer to specify, for example, the distance between rows of standard cells and whether the row should be positioned rightside up or upside down.

There are other times when a logic designer may wish to manually specify the placement of standard cells. For instance, as noted above, there may be a regularity to the structure that is not readily discoverable by automatic placement algorithms. Putting the manual placement in the hands of the logic designer removes the uncertainty associated with random run-to-run variations characteristic of automated heuristic algorithms. Take, for example, the following module, regCell8, which is composed of eight regCell modules:

```
module regCell8 (dout0, dout1, din, we, re0, re1);
    input [7:0] din;
    input we, re0, re1;
    output [7:0] dout0, dout1:
    tri [7:0] dout0, dout1;
    regCell r0 (dout0[0], dout1[0], din[0], we, re0, re1);
    regcell r1 (dout0[1], dout1[1], din [1], we, re0, re1);
    regCell r2 (dout0[2], dout1[2], din [1], we, re0, re1);
    regCell r3 (dout0[3], dout1[3], din [3], we, re0, re1);
    regCell r4 (dout0[4], dout1[4], din [4], we, re0, re1);
    regCell r5 (dout0[5], dout1[5], din [5], we, re0, re1);
    regCell r6 (dout0[6], dout1[6], din [6], we, re0, re1);
```

-continued

```
    regCell r7 (dout0[7], dout1[7], din [7], we, re0, re1);
    /*CAD
        for (int i = 1; i<7;i ++ {
            align Corner (BR, "r" = i, BL, "r" + (i + 1));
        }
    */
endmodule
```

Figure 5:
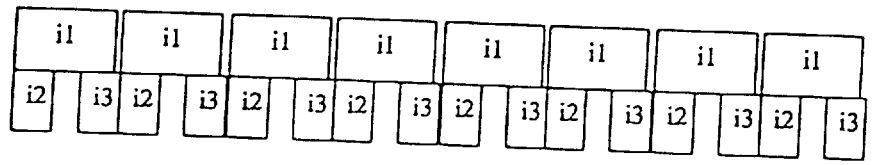
FIG. 5 is a diagram illustrating a layout of a series of register cells.

Through the use of the physical design annotations appearing in the comments, the logic designer has specified how the layout of regCell8 is composed from the layout of eight regCells. The "alignCorner" method allows the corners of any two instances to be aligned with one another. The first and third arguments to "alignCorner" specify which corners are to be aligned with each other. The inputs BR, BL, TR, and TL refer to bottom, right, bottom left, top right, and top left, respectively. The second and fourth arguments specify the instances to be aligned. For example, when the loop executes, it specifies that the bottom right corner of cell r0 should be adjacent to the bottom left corner of cell r1, the bottom right corner of cell r1 should be adjacent to the bottom left corner of cell r2, etc. The result is that eight instances of regCell are abutted in a row as shown in FIG. 5. It should be noted that manual layout based on corner alignment, rather than by fixed coordinates, is advantageous because it is technology independent. That is, by specifying only the relative location of objects, even if the technology underlying those objects changes (and, thus, their size), the physical design will still be consistent with the designer's intentions.

Another set of useful annotations relate to the synthesis of the modules. When an RTL program is synthesized into a corresponding collection of standard cells, a unique set of cells is typically created for each instance of the design. In the register example above, there is a single regCell module which is instantiated 2048 (64×32) distinct times. The synthesis tool then optimizes each instance independently of all others because each might have different timing constraints on its inputs and outputs. For some designs, such as this one, however, this process of separately optimizing all the instances of regCell is inappropriate. The logic designer knows that there is no advantage to making any instance of regCell different from any other and, indeed, the overall design may depend upon all cells being identical. To save the time of separately optimizing each instance of regCell, and to prevent a result in which some instances of the module are different from others, the designer can specify to the synthesis tool to synthesize a particular module once and share the result between all instances of the same module. Other functions allow the designer to pass additional requirements about how the design should be synthesized, such as timing and loading constraints of the I/O pins.

Yet another set of useful design directives relates to the physical dimension matching of one module to another. For example, suppose in our register example we would like to match the height of the decoder to the core height and the width of the data buffers to the width of the core.

```
module regFile (dout0, dout1, ra0, ra1, wa, we, din);
    input [4:0] ra0, ra1, wa;
    input we;
    input [63:0] dout_tri0, dout_tri1,
```

```
    wire [31:0] rsel0, rsel1, wsel;
    wire [63:0] iDin;
    decoder dec (rsel0, rsel1, wsel, ra0, ra1, wa, we);
    regCore regc (dout_tri0, dout_tri1, iDin, wsel, rsel0, rsel1);
    dataBuffers dbuf (dout0, dout_tri0, dout1, dout_tri1, iDin, din);
    /*CAD
        passParam("dec", "height", getHeight("regc"));
        alignCorner (BR, "dec", BL, "regc");
        passParam("dbuf", "width", getWidth(regc"));
        alignCorner (TL, "dbuf", BL, "regc");
    */
endmodule
```

Figure 6:
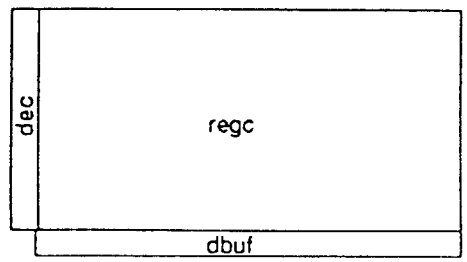
FIG. 6 is a diagram illustrating a layout of a register file.

The "getHeight" and "getWidth" methods determine the height and width of the register core ("regc") layout. These parameters are then passed using the "passParam" function to set the height of the decoder module ("dec") and the width of the data buffer module ("dbuf"). These modules, in turn, receive these parameters using the "getParamValue" function and are constructed according to the received parameters. The above module further dictates that the bottom right corner of the decoder should be aligned with the bottom left corner of the core, and that the top left corner of the data buffer should be aligned with the bottom left corner of the core. The resulting layout is shown in FIG. 6.

The technique of passing parameters to perform dimension matching of components has the additional benefit of technology independence. If height and width parameters are "hard-coded" as constants, rather than passed as parameters, the resulting design may not reflect the designer's intentions if the underlying technology (e.g., size of components) changes.

Additional physical design directives relate to the routing of the chip. Some annotations invoke an automatic router to automatically wire up a module. Other annotations allow the designer to specify the location of wires in the chip. Manual routing is useful when there are regular arrays of interconnect, or for pre-routing large busses. Still other annotations allow control over the routing of power, clock, and scan signals. Power, clock, and scan signals are usually handled differently than normal signals because they must meet additional constraints and because they interact with the physical design.

It is also important for the CAD program to support incremental designs. Thus, annotations could allow the designer to enter estimates for area, width, and/or height in those cases when the module has not yet been fully designed. Other annotations could allow the designer to specify the position of wires entering or leaving the module, allowing the designer to experiment with physical design before the entire chip has been designed.

Although the above describe preferred embodiments uses Java code embedded in the comments of a hardware description language program, it should be noted that other programming languages would also be appropriate.

It should also be noted that, although the embodiment consistent with the present invention provides the logic designer with substantial control over the physical design of a chip, the logic designer need not include annotations for modules for which the designer has no intuition about the physical design. In that case, the CAD program would use traditional physical layout algorithms on the un-annotated modules.

Processing of Annotated Descriptions

When the CAD program receives the annotated description of a circuit design, the CAD program interprets the annotations to determine what actions to perform on the specified description. Typically, the actions will involve the selection and invocation of automated logical and physical design tools embodied, for example, in software processes. Examples of such tools include tools for synthesis of logical modules into physical cells, automated placement of physical cells, automated routing of physical cells, and automated composition in accordance with user-defined parameters. It will be obvious that embodiments may include other tools as well, such as design rule checkers and parasitic extractors, without departing from the scope of the invention.

In addition to determining those tools that are to be invoked in connection with an annotated description, one or more embodiments of the invention perform further analysis of the logical information of the description and the physical information of the annotations to optimize the manner in which tool execution is scheduled, and to take advantage of prior iterations of a description of a particular circuit design. For example, the CAD program may take advantage of parallel processing resources for independent building steps. Also, information from previous design iterations may be used to prune redundant steps, and to take advantage of the results of previous builds.

Figure 7:
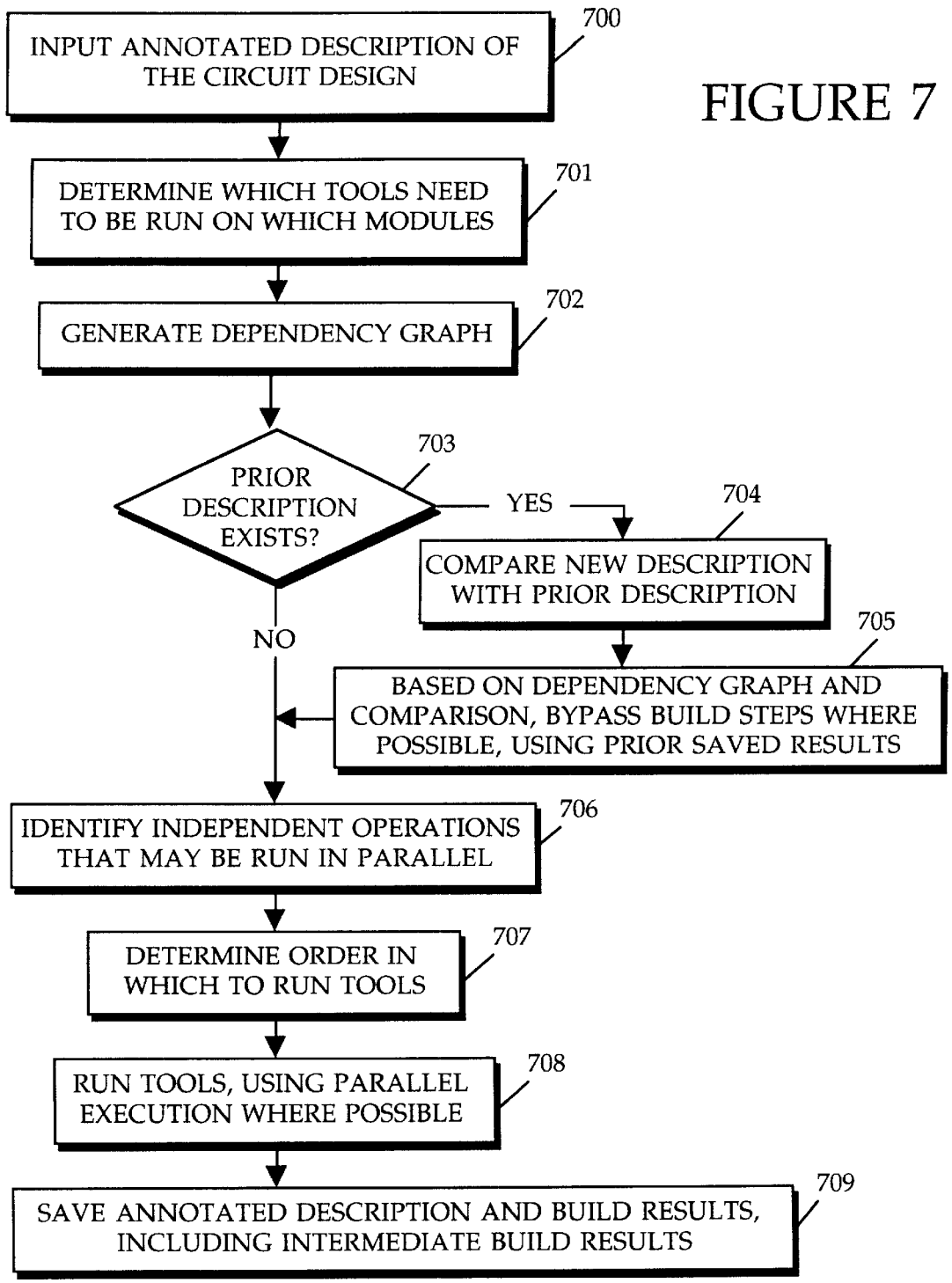
FIG. 7 is a flow diagram of a method for processing an annotated description in accordance with an embodiment of the invention.

FIG. 7 is a flow diagram illustrating a method for processing an annotated description in accordance with an embodiment of the invention. In step 700, the annotated description of the circuit design is provided as input into the CAD program implementing the invention. In step 701, the CAD program identifies which tools are invoked by the annotated description, and which modules are to be acted on by those tools. Each instance of a tool operating on a module (e.g., "Synthesize regCell" or "Autoplace dataBuffers") may be considered as an individual step in the process of building the specified circuit.

In step 702, a dependency graph is generated specifying which of those individual steps are dependent upon which other individual steps in order to be executed. For example, where a design calls for the synthesis and placement of a module, the module must first be synthesized into a set of standard cells before those cells can be placed in the physical layout. The dependency graph may be used on its own to determine an ordering of the individual steps that satisfies all dependencies, or optimizing steps (e.g., steps 703–706) may be performed first to increase the efficiency of the system.

In step 703, the CAD program determines whether a cached description from a prior design iteration exists in memory. If no prior description exists (e.g., this is the first build of the design), then the CAD program continues at step 706. However, if a prior description does exist, then, in step 704, the current description is compared with the prior description to identify those portions of the description that have been revised since the last iteration. In step 705, based on the dependency graph and the results of the comparison, redundant build steps are bypassed and cached results from the prior build iteration are substituted into the current build.

In step 706, if parallel processing resources are available, the dependency graph is used to determine those individual build steps (less those steps bypassed in step 705) that can be executed in parallel. In step 707, the CAD program determines the scheduled order in which the individual build steps are to be executed, using the information regarding parallel processes from step 706 to perform parallel scheduling where possible. One ordering scheme is to traverse one branch of the dependency graph (neglecting redundant steps that may be pruned from the graph) until a multi-dependent step is reached that cannot be executed, and proceeding to traverse other branches until the multi-dependent step may finally be traversed (i.e., executed). Parallel processing resources may facilitate the traversal of multiple branches concurrently.

In step 708, the individual steps are executed as scheduled. In step 709, the current description, as well the intermediate results of the executed build steps, are cached in memory to be used in connection with future design iterations.

In caching the description, separate copies of the description may be saved to facilitate separate identification of changes in logical and physical aspects of the description. For example, one copy may contain only non-annotated elements of the description, and another copy may contain only annotations of the description. The annotations of the description specify physical aspects of the design, whereas the non-annotated portions of the description relate to logical aspects of the design. Thus, comparison of descriptions without annotations (e.g., with the annotations extracted), provides information with respect to logical revisions, whereas comparison of only the annotations of respective descriptions provides information with respect to physical revisions.

Figure 8:
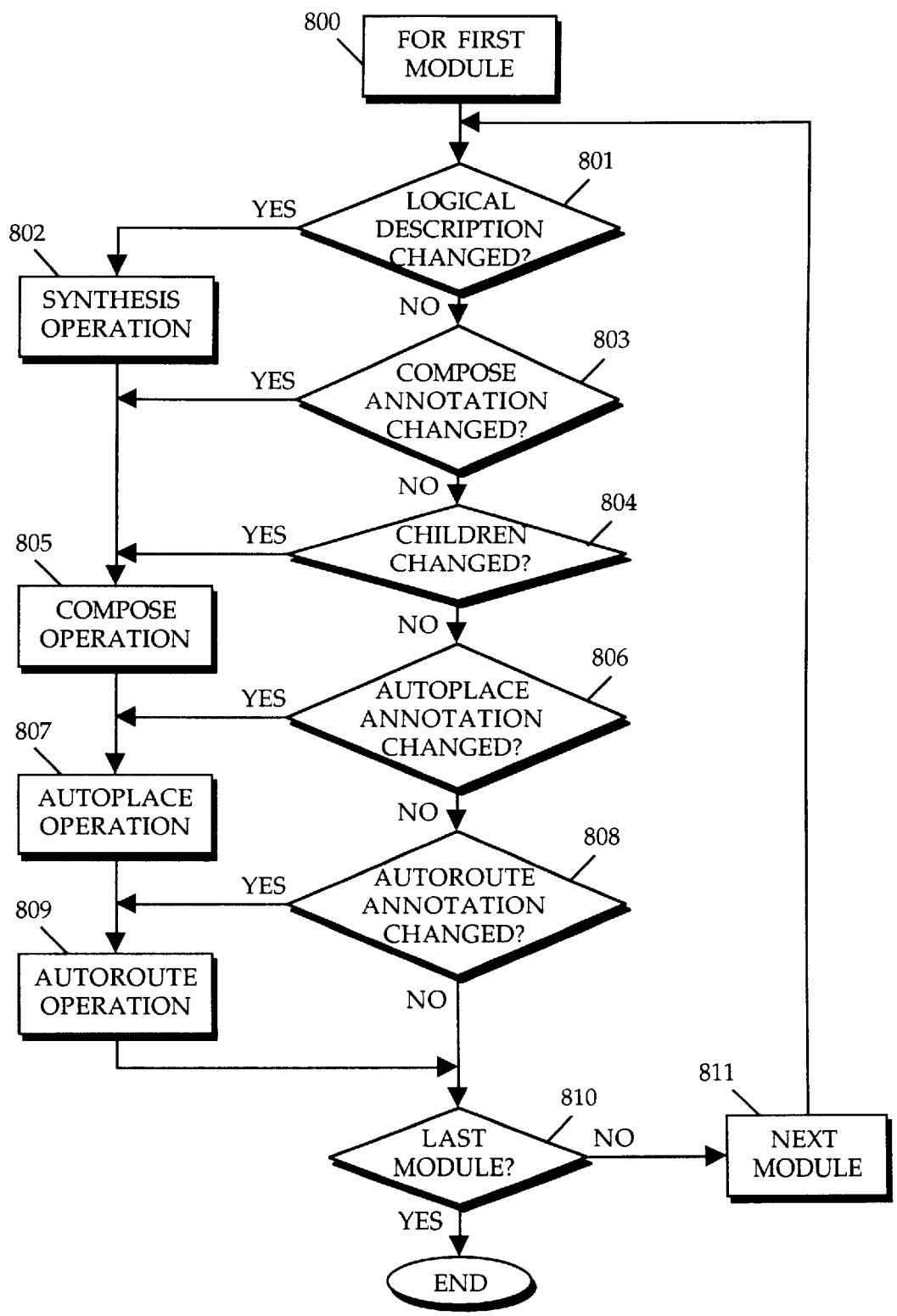
FIG. 8 is a flow diagram of a method for determining which logical and physical processing steps are executed in connection with an annotated description, in accordance with an embodiment of the invention.

FIG. 8 is a flow diagram of a by pass analysis method for determining which logical and physical processing steps are executed in connection with an annotated description, in accordance with an embodiment of the invention. The method cycles through the modules of the description for which at least one of the tools is called. The order in which the modules are cycled may vary for different embodiments. However, by cycling through the modules in accordance with traversal of the dependency graph (e.g., beginning with an independent built step), individual build steps of the dependency graph may be easily pruned with respect to later ordering of unbypassed (i.e., unpruned) build steps for execution.

In FIG. 8, steps 801–802 relate to the synthesis tool. If the synthesis tool is not called for the current module, then steps 801–802 may be skipped, with the method continuing at step 803. Similarly, steps 803 and 805 relate to the compose tool, steps 806–807 relate to the autoplace tool, and steps 808–809 relate to the autoroute tool. For those tools not called in the current module, the associated steps may be bypassed.

The execution of specific build operations or build steps are carried out in steps 802, 805, 807 and 809, in that order. The order is determined based on a chain of operational dependencies. For example, re-execution of an autoplace operation (807) necessitates re-execution of an autoroute operation (809), re-execution of a compose operation (805) necessitates re-execution of the autoplace operation (807), and re-execution of a synthesis operation (802) necessitates re-execution of the compose operation (805), giving rise to the ordering of FIG. 8. Decision steps 801, 803–804, 806, and 808 specify where in the chain of build operations execution is begun for the current module. Though the example of FIG. 8 illustrates the use of particular build steps (i.e., synthesis, compose, autoplace and autoroute), it will be obvious that other build steps, in addition to or in place of the described build steps, may be used in a similar manner.

In step 800, a first module (from the set of modules in the description) is selected as the current module for bypass analysis. In step 801, the logical description associated with the current module is compared with the corresponding prior logical description to determine whether the logical description has been revised. This may entail, for example, comparing the unannotated module descriptions. If in step 801 the logical description has not changed, synthesis may be bypassed for the current module (assuming that any modules that the current module is dependent on are also not logically revised). When synthesis is bypassed, the cached results from prior synthesis are used, and the method continues at step 803. If, however, in step 801 the logical description has been revised (or if the module is new), the module is synthesized in step 802, and the method continues at step 805. In subsequent steps 805, 807 and 809, a compose operation, autoplace operation and autoroute operation, respectively, are executed on the current module.

In step 803, the physical description associated with the current module is compared with the corresponding prior physical description to determine whether any annotations associated with the compose tool (i.e., "compose annotations") have been revised. This may entail, for example, comparing the extracted annotations of the descriptions. If no compose annotations have changed, then the method continues at step 804 in which the CAD program determines whether any children of the current module (e.g., cells upon which the current module is dependent) have changed. If the current module does not have such dependencies, then the method continues at step 806, bypassing execution of the compose tool for the current module and using any cached prior results. However, if the compose annotations have changed in step 803, or, if one or more children have changed in step 804, the compose tool is executed on the current module in step 805, followed by autoplace and autoroute operations in steps 807 and 809, respectively.

In step 806, the physical description associated with the current module is compared with the corresponding prior physical description to determine whether any annotations associated with the autoplace tool (i.e., "autoplace annotations") have been revised. If no autoplace annotations have changed, then the method continues at step 808. However, if the autoplace annotations have changed in step 806, the autoplace tool is executed on the current module in step 807, followed by execution of the autoroute operation in step 809.

In step 808, the physical description associated with the current module is compared with the corresponding prior physical description to determine whether any annotations associated with the autoroute tool (i.e., "autoroute annotations") have been revised. If no autoroute annotations have changed, then the method continues at step 810. However, if the autoroute annotations have changed in step 808, the autoroute tool is executed on the current module in step 809.

Steps 808 and 809 lead into step 810, where the CAD program checks whether the current module is the last module in the description. If the current module is not the last module, then the next unanalyzed module is selected for by pass analysis in step 811, and the method returns to step 801. If the current module is the last module, then the method is completed.

The previously described method provides for fine grained analysis of build steps for the purpose of by passing execution at the tool level. It is also possible to perform a more coarsely grained analysis of build steps by grouping multiple tools under one decision, where the decision is based on the presence or absence of revisions made to the set of possible annotations associated with the combined tools. Whereas a coarser grained analysis simplifies the implementation of the bypass method by reducing the number of decisions, the finer grained analysis provides higher performance efficiency through greater execution selectivity.

Register File Example

An example of an annotated RTL description for a 32×64 register file is printed in its entirety in section A. The annotations to the modules of the register file ("regFile") description are described below.

In the "regCell" module, the "synthesize" annotation directs the CAD program to synthesize (e.g., execute the synthesize tool) the regCell module separately. The "addFeedthrough" annotation directs the CAD program to add wires. The "autoPlace" annotation directs the CAD program to use the automatic placer tool to place all the cells in regCell into a rectangle, and the "autoRoute" annotation directs the CAD program to automatically route all wires in module regCell.

Module "regCell8" instantiates eight instances of regCell. The "addCornerAlign" annotations direct the CAD program to abut the eight regCells horizontally. Similarly, module "row" abuts eight regCell8 instances into a horizontal row. Module "row8" abuts eight rows vertically, whereas module regCore abuts four row8 instances vertically.

Module "decoder32_read" synthesizes itself and autoplaces itself into a rectangle whose height is specified by the "height" parameter. Module "decoder32_write" also synthesizes itself and autoplaces itself in a rectangle whose height is specified by the "height" parameter. Module "decoder" instantiates two decoder32_read and one decoder32_write, and abuts them horizontally.

Module "dataBuffers" synthesizes itself and autoplaces itself into a rectangle whose width is passed in by the "width" parameter.

Module "regFile" instantiates one decoder, regCore and dataBuffers. regFile also sets the height of the decoder to the height of the regCore, and the width of the dataBuffers to the width of the regCore.

Matching the tools Synthesis, Autoplace, Autoroute and Compose with the modules of the annotated circuit design description, the following table is built. Each "X" represents an individual build step where the designated tool processes the designated module.

TABLE 1

Matching Tools to regfile Circuit Modules/Cells

|  | SYNTHESIZE | AUTO-PLACE | AUTOROUTE | COM-POSE |
|---|---|---|---|---|
| regCell | X | X | X |  |
| regCell8 |  |  |  | X |
| row |  |  |  | X |
| row8 |  |  |  | X |
| regCore |  |  |  | X |
| decoder32_write | X | X |  |  |
| decoder32_read | X | X |  |  |
| decoder |  |  |  | X |
| dataBuffers | X | X |  |  |
| regFile |  |  | X | X |

Figure 9:
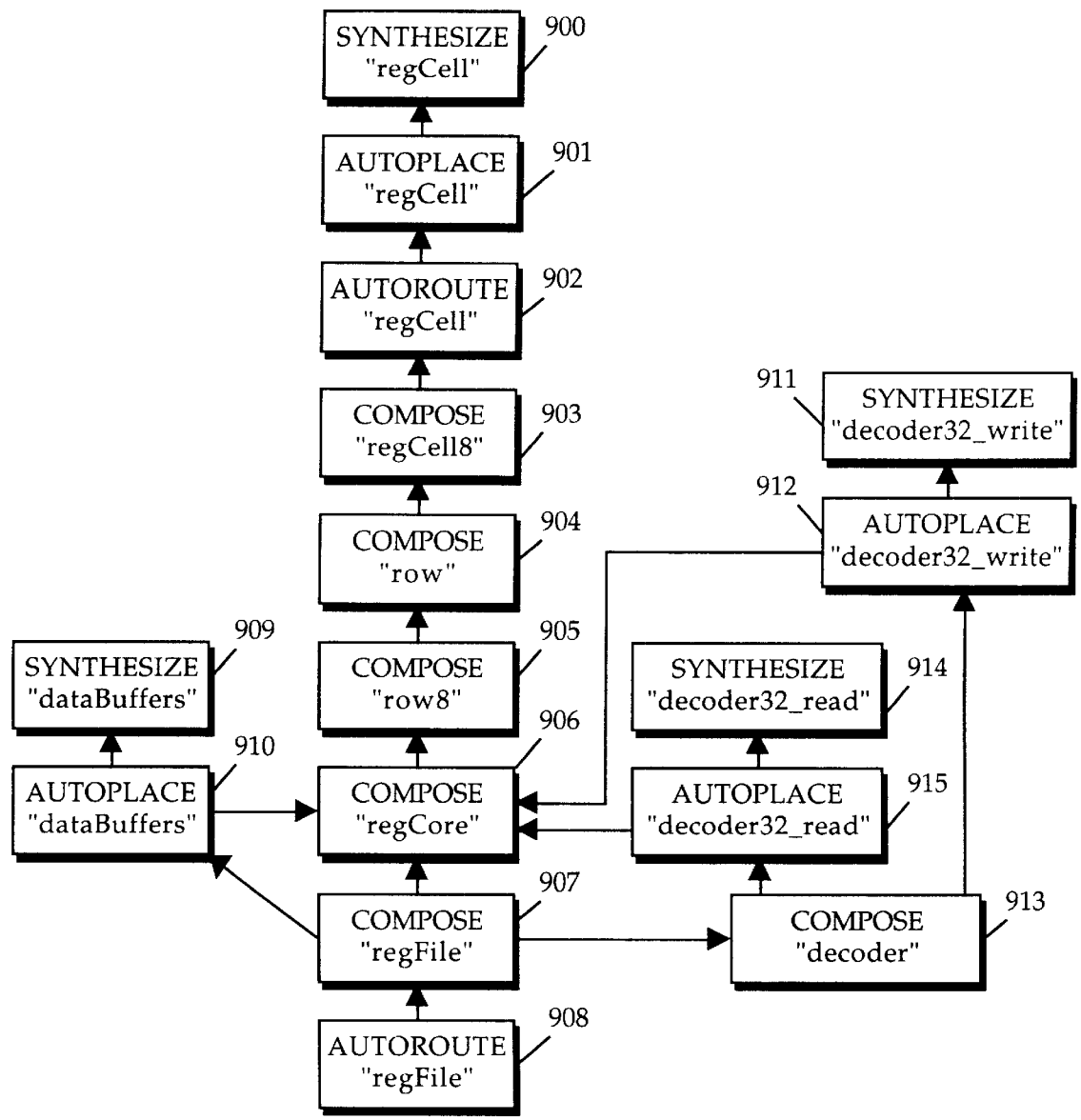
FIG. 9 is an example of a dependency graph generated in accordance with an embodiment of the invention.

FIG. 9 is a dependency graph that is implied by the physical and logical description of regFile. In the graph, each box represents an individual build step from the above table, where the arrows designate dependency relationships. The arrow points to a build step on which the source build step is dependent.

Specifically, "Autoroute regFile" 908 is dependent on "Compose regFile" 907. "Compose regFile" 907 is dependent on "Compose regCore" 906, "Autoplace dataBuffers" 910 and "Compose decoder" 913. "Autoplace dataBuffers" 910 is dependent on "Compose regCore" 906 (because regCore passes the placement height) and "Synthesize dataBuffers" 909. "Compose decoder" 913 is dependent on "Autoplace decoder32_read" 915 and "Autoplace decoder 32_write" 912. "Autoplace decoder32_read" 915 is dependent on "Compose regCore" 906 (because regCore passes the placement width) and "Synthesize decoder32_read" 914. "Autoplace decoder32_write" 912 is dependent on "Compose regCore" 906 (because regCore passes the placement width) and "Synthesize decoder32_write" 911. "Compose regCore" 906 is part of a single dependency chain (or graph branch) comprising the following elements in order of dependency: "Compose regCore" 906, "Compose row8" 905, "Compose row" 904, "Compose regCell8" 903, "Autoroute regCell" 902, "Autoplace regCell" 901 and "Synthesize regCell" 900.

The dependency graph establishes an order for many operations. For example, the CAD program must synthesize (909) the dataBuffers before it can run automatic placement (910) of the dataBuffers. Dependencies are transitive along branches of the graph. For example, the CAD program must synthesize (909) the dataBuffers before it can route (908) the register file (regFile).

The dependency graph also shows that some operations are unordered and may be done in parallel. For example, the synthesis (909) of dataBuffers may be done in parallel with routing (902) of regCell due to the independence of those operations.

Finally, the dependency graph shows what needs to be updated when portions of the circuit design are revised or updated. For example, if the logical design of decoder32_read is changed (and nothing else), then decoder32_read must be resynthesized (914) and automatically placed (915), the decoder must be composed (913), the regFile must be composed (907) and routed (908), in that order. All other operations can be bypassed because the CAD program can reuse the cached intermediate results from the previous build.

Thus, a method and apparatus for building an integrated circuit have been described in conjunction with one or more specific embodiments. The invention is defined by the claims and their full scope of equivalents.

SECTION A

```
//
//      32 x 64 bit register file
//
module regCell (dout0, dout1, din, we, re0, re1);
    input din, we, re0, re1;   output dout0, dout1;
    tri dout0, dout1;    reg q;
    always @ (we)
        begin if (we) q = din; end
    bufif1 b0(dout0, q, re0);
    bufif1 b1(dout1, q, re1);
    /*CAD
        synthesize("regCell.dc");
        addFeedthrough("h", "re0");
        addFeedthrough("h", "re1");
        addFeedthrough("h", "we");
        addFeedthrough("v", "dout0");
        addFeedthrough("v", "dout1");
        addFeedthrough("v", "din");
        setUtilRate(0.80);
        setAspectRatio(2.0);
        autoPlace( );
```

-continued

SECTION A

```
        autoRoute( );
    */
endmodule
module regCell8 (dout0, dout1, din, we, re0, re1);
    input [7:0] din;
    input we, re0, re1;
    output [7:0] dout0, dout1;
    tri [7:0] dout0, dout1;
    regCell r0(dout0[0], dout1[0], din[0], we, re0, re1);
    regCell r1(dout0[1], dout1[1], din[1], we, re0, re1);
    regCell r2(dout0[2], dout1[2], din[2], we, re0, re1);
    regCell r3(dout0[3], dout1[3], din[3], we, re0, re1);
    regCell r4(dout0[4], dout1[4], din[4], we, re0, re1);
    regCell r5(dout0[5], dout1[5], din[5], we, re0, re1,);
    regCell r6(dout0[6], dout1[6], din[6], we, re0, re1);
    regCell r7(dout0[7], dout1[7], din[7], we, re0, re1);
    /*CAD
        synthesizeSkipCompile( );
        for(int i = 0; i < 7; i++)
            addCornerAlign("LR", "r" + i, "LL", "r" + (i + 1));
        }
    */
endmodule
module row (dout0, dout1, din, we, re0, re1);
    input [63:0] din;
    input we, re0, re1;
    output [63:0] dout0, dout1;
    tri [63:0] dout0, dout1;
    regCell8 r0(dout0[7:0], dout1[7:0], din[7:0], we, re0, re1);
    regCell8 r1(dout0[15:8], dout1[15:8], din[15:8], we, re0, re1);
    regCell8 r2(dout0[23:16], dout1[23:16], din[23:16], we, re0, re1);
    regCell8 r3(dout0[31:24], dout1[31:24], din[31:24], we, re0, re1);
    regCell8 r4(dout0[39:32], dout1[39:32], din[39:32], we, re0, re1);
    regCell8 r5(dout0[47:40], dout1[47:40], din[47:40], we, re0, re1);
    regCell8 r6(dout0[55:48], dout1[55:48], din[55:48], we, re0, re1);
    regCell8 r7(dout0[63:56], dout1[63:56], din[63:56], we, re0, re1);
    /*CAD
        synthesizeSkipCompile( );
        for (int j = 0; j < 4; j++) {
            int i = 2 * j;
            addCornerAlign("LR", "r" + (i), "LL", "r" + (i + 1));
            if (j < 3) {
                createPowerStripeFeed("feed" + j, getHeight("r" +
                    (i+1)));
                addCornerAlign("LR", "r" + (i+1), "LL", "feed" + j);
                addCornerAlign("LR", "feed" + j, "LL", "r" + (i+2));
            }
        }
    */
endmodule
module row8 (dout0, dout1, din, we, re0, re1);
    input [63:0] din;
    input [7:0] we, re0, re1;
    output [63:0] dout0, dout1;
    tri [63:0] dout0, dout1;
    row r0(dout0, dout1, din, we[0], re0[0], re1[0]);
    row r1(dout0, dout1, din, we[1], re0[1], re1[1]);
    row r2(dout0, dout1, din, we[2], re0[2], re1[2]);
    row r3(dout0, dout1, din, we[3], re0[3], re1[3]);
    row r4(dout0, dout1, din, we[4], re0[4], re1[4]);
    row r5(dout0, dout1, din; we[5], re0[5], re1[5]);
    row r6(dout0, dout1, din, we[6], re0[6], re1[6]);
    row r7(dout0, dout1, din, we[7], re0[7], re1[7]);
    /*CAD
        synthesizeSkipCompile( );
        for (int i = 0; i < 7; i++) {
            addCornerAlign("LL", "r" + i, "UL", "r" + (i + 1));
        }
    */
endmodule
module regCore (dout0, dout1, din, we, re0, re1);
    input [63:0] din;
    input [31:0] we, re0, re1;
    output [63:0] dout0, dout1;
    tri [63:0] dout0, dout1;
    row8 r0(dout0, dout1, din, we[7:0], re0[7:0], re1[7:0]);
    row8 r1(dout0, dout1, din, we[15:8], re0[15:8], re1[15:8]);
```

-continued

SECTION A

```
    row8 r2(dout0, dout1, din, we[23:16], re0[23:16], re1[23:16]);
    row8 r3(dout0, dout1, din, we[31:24], re0[31:24], re1[31:24]);
    /*CAD
        synthesizeSkipCompile( );
        for (int i = 01; i < 3; i++) {
            addCornerAlign("LL", "r" + i, "UL", "r" + (i + 1));
        }
    */
endmodule
module decoder32 (out, sel, en);
    parameter height = 0;
    input [4:0] sel;
    input en;
    output [31:0] out;
    reg [31:0] out;
    always @ (sel or en)
    begin
        out = 0;
        if (en)
            out[sel] = 1;
    end
endmodule
module decoder32_read (out, sel);
    parameter height = 0;
    input [4:0] sel;
    output [31:0] out;
    reg [31:0] out;
    decoder32 d(out, sel, 1'b1);
    /*CAD
        synthesize("decoder32_read.dc");
        setUtilRate(0.25);
        for (int i = 4; i >= 0; i--)    placePort('L', "sel<" + i + ">");
        for (int i = 31; i >= 0; i--)   placePort('R', "out<" + i + ">");
        autoPlace( );
    */
endmodule
module decoder32_write (out, sel, we);
    parameter height = 0;
    input [4:0] sel;
    input we;
    output [31:0] out;
    reg [31:0] out;
    decoder32 d(out, sel, we);
    /*CAD
        synthesize("decoder32_write.dc");
        setUtilRate(0.85);
        for (int i = 4; i >= 0; i--)    placePort('L', "sel<" + i +0 ">");
        for (int i = 31; i >= 0; i--)   placePort('R', "out<" + i + ">");
        placePort('B', "we");
        autoPlace( );
    */
endmodule
module decoder (rsel0, rsel1, wsel, ra0, ra1, wa, we);
    parameter height = 0;
    input [4:0] ra0, ra1, wa;
    input we;
    output [31:0] rsel0, rsel1, wsel;
    decoder32_read d0(rsel0, ra0);
    decoder32_read d1(rsel1, ra1);
    decoder32_write d2(wsel, wa, we);
    /*CAD
        synthesizeSkipCompile( );
        int h = getParamValue("height");
        passParam("d0", "height", h);
        passParam("d1", "height", h);
        passParam("d2", "height", h);
        addCornerAlign("LR", "d0", "LL", "d1");
        addCornerAlign("LR", "d1", "LL", "d2");
    */
endmodule
module dataBuffers(eOut0, out0, eOut1, out1, in, eIn);
    parameter wid = 0;
    input [63:0] out0, out1, eIn;
    output [63:0] eOut0, eOut1, in;
    assign eOut0 = ~out0;
    assign eOut1 = ~out1;
    assign in = ~eIn;
```

-continued

SECTION A

```
/*CAD
    double util_rate = 0.85;
    synthesize("dataBuffers.dc");
    int w = getParamValue("wid");
    setWidth(w);
    setUtilRate(util_rate);
    int step = w/64;
    for (int i = 0; i < 64; i++) {
        placePort('B', "eOut0<" + i + ">", step/2 + i * step);
        placePort('T', "out0<" + i + ">", step/2 + i * step);
        placePort('B', "eOut1<" + i + ">", step/2 + i * step);
        placePort('T', "out1<" + i + ">", step/2 + i * step);
        placePort('T', "in<" + i + ">", step/2 + i * step);
        placePort('B', "eIn<" + i + ">", step/2 + i * step);
    }
    autoPlace( );
*/
endmodule
module regFile (dout0, dout1, ra0, ra1, wa, we, din);
    input [4:0] ra0, ra1, wa;   input we;   input [63:0] din;
    output [63:0] dout0, dout1;   tri [63:0] dout_tri0, dout_tri1;
    wire [31:0] rsel0, rsel1, wsel;   wire [63:0] iDin;
    decoder dec(rsel0, rsel1, wsel, ra0, ra1, wa, we);
    regCore regc(dout_tri0, dout_tri1, iDin, wsel,:rsel0, rsel1);
    dataBuffers dbuf(dout0, dout_tri0, dout1, dout_tri1, iDin, din);
    /*CAD
        synthesizeSkipCompile( );
        int h = getHeight("regc");
        passParam("dec", "height", h);
        addCornerAlign("LR", "dec", "LL", "regc");
        int w = getWidth("regc");
        passParam("dbuf", "wid", w);
        addCornerAlign("UL", "dbuf", "LL", "regc");
        doPowerRing( )
        route( );
    */
endmodule
```

What is claimed is:

1. In a computer system, a method comprising:

determining a plurality of build operations to be performed based on a description of a circuit design;

determining an order of said build operations based on dependencies between said build operations;

associating a plurality of elements of said description with said plurality of build operations, wherein;

said plurality of elements comprise a logical description and one or more annotations, said associating comprising:

associating said logical description with one or more logical build operations; and associating said one or more annotations with one or more physical build operations; and executing said build operations in said order.

2. The method of claim 1, further comprising generating a dependency graph.

3. The method of claim 1, further comprising:

determining a plurality of independent build operations; and scheduling said plurality of independent build operations for concurrent execution on a plurality of processors.

4. The method of claim 1, further comprising storing intermediate results of said build operations.

5. The method of claim 1, further comprising:

determining one or more unchanged elements of said description;

bypassing execution of one or more build operations related to said one or more unchanged elements; and utilizing stored results from a corresponding prior build operation.

6. The method of claim 5, wherein determining one or more unchanged elements comprises comparing said description with a prior description.

7. A computer program product comprising:

a computer readable medium having computer program code embodied therein for building a circuit, the computer readable medium comprising computer program code configured to cause a computer to:

determine a plurality of build operations to be performed based on a description of a circuit design;

determine an order of said build operations based on dependencies between said build operations;

associate a plurality of elements of said description with said plurality of build operations, wherein;

said plurality of elements comprise a logical description and one or more annotations, said associating comprising:

associating said logical description with one or more logical build operations; and associating said one or more annotations with one or more physical build operations; and execute said build operations in said order.

8. The computer program product of claim 7, wherein said computer program code is further configured to generate a dependency graph.

9. The computer program product of claim 7, wherein said computer program code is further configured to:

determine a plurality of independent build operations; and schedule said plurality of independent build operations for concurrent execution on a plurality of processors.

10. The computer program product of claim 7, wherein said computer program code is further configured to store intermediate results of said build operations.

11. The computer program product of claim 7, wherein said computer program code is further configured to:

determine one or more unchanged elements of said description;

bypass execution of one or more build operations related to said one or more unchanged elements; and utilize stored results from a corresponding prior build operation.

12. The computer program product of claim 11, wherein determining one or more unchanged elements comprises comparing said description with a prior description.

13. In a computer system, an apparatus comprising:

a description of a circuit design, said description comprising one or more modules;

a plurality of build tools configured to execute build operations;

a process receiving said description of said circuit design, said process configured to:

determine a plurality of build operations to be performed based on said description;

determine an order of said plurality of build operations based on dependencies between said build operations;

associate a plurality of elements of said description with said plurality of build operations, wherein;

said plurality of elements comprise a logical description and one or more annotations, said logical description being associated with one or more logical build operations, and said one or more annotations being associated with one or more physical build operations; and invoke said build tools to execute said plurality of build operations in said order.

14. The apparatus of claim 13, further comprising a dependency graph generated by said process, said dependency graph specifying said dependencies.

15. The apparatus of claim 13, further comprising a plurality of processors, wherein said process is further configured to:

determine a plurality of independent build operations; and schedule said plurality of independent build operations for concurrent execution on said plurality of processors.

16. The apparatus of claim 13, further comprising a memory, said memory comprising a prior description and intermediate results of said built operations.

17. The apparatus of claim 13, wherein said process is further configured to:

bypass execution of one or more build operations related to one or more unchanged elements; and utilize stored results from a corresponding prior build operation.

18. The apparatus of claim 17, wherein said process is further configured to compare said description with a prior description to determine said one or more unchanged elements.

* * * * *